(12) United States Patent
Lucas et al.

(10) Patent No.: US 7,284,231 B2
(45) Date of Patent: Oct. 16, 2007

(54) LAYOUT MODIFICATION USING MULTILAYER-BASED CONSTRAINTS

(75) Inventors: Kevin D. Lucas, Meylan (FR); Robert E. Boone, Grenoble (FR); Mehul D. Shroff, Austin, TX (US); Kirk J. Strozewski, Round Rock, TX (US); Chi-Min Yuan, Austin, TX (US); Jason T. Porter, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 358 days.

(21) Appl. No.: 11/018,637

(22) Filed: Dec. 21, 2004

(65) Prior Publication Data

US 2006/0136861 A1    Jun. 22, 2006

(51) Int. Cl.
*G06F 17/50* (2006.01)

(52) U.S. Cl. .......................................... 716/21; 716/19

(58) Field of Classification Search ................. 716/19, 716/21

See application file for complete search history.

(56) References Cited

U.S. PATENT DOCUMENTS

| | | | |
|---|---|---|---|
| 5,958,635 A | 9/1999 | Reich et al. | |
| 7,065,729 B1 * | 6/2006 | Chapman | 716/13 |
| 7,115,343 B2 * | 10/2006 | Gordon et al. | 430/5 |
| 2003/0121021 A1 * | 6/2003 | Liu et al. | 716/19 |
| 2004/0107410 A1 * | 6/2004 | Misaka et al. | 716/8 |
| 2005/0196681 A1 * | 9/2005 | Croffie et al. | 430/5 |
| 2005/0202321 A1 | 9/2005 | Gordon et al. | |
| 2006/0107249 A1 * | 5/2006 | Zhang et al. | 716/21 |

OTHER PUBLICATIONS

International Search Report and Written Opinion

\* cited by examiner

*Primary Examiner*—Vuthe Siek
*Assistant Examiner*—Magid Y. Dimyan
(74) *Attorney, Agent, or Firm*—Michael J. Balconi-Lamica (57) ABSTRACT

A method for improving manufacturability of a design includes performing space or enclosure checks on multiple interacting layers of a layout design and then using the resulting space or enclosure data to move predetermined feature edges in an altered design database to decrease the risk of features widths, feature spaces or feature enclosures being patterned smaller than designed. In some embodiments, the upsized features are larger in the wafer circuit pattern than are drawn in a designed database. The method for improving manufacturability of a design, in some embodiments, is stored on a computer readable storage medium.

22 Claims, 8 Drawing Sheets

LAYOUT MODIFICATION USING
MULTILAYER-BASED CONSTRAINTS

BACKGROUND

The present invention relates to integrated circuits, and, more particularly, to processing the physical layout of circuitry for subsequent manufacture of such integrated circuits.

RELATED ART

During the manufacture of integrated circuits, certain residual yield loss occurs due to local die failures such as reticle errors, small defects, overlay errors, process window limiting features, and the like. Typical resulting problems include contact, via and metal electrical opens. Traditionally, optical proximity correction (OPC) and isolated metal feature upsizing are used to improve global process windows on a single layer by single layer basis.

Accordingly, it would be desirable to provide a method to more efficiently correct for such errors through layout modification using multiple layer based constraints to aid designing for manufacturability and for overcoming problems in the art.

SUMMARY

According to one embodiment, a method for improving manufacturability of a design includes performing space or enclosure checks on multiple interacting layers of a layout design. The method further includes using resulting space or enclosure data to move predetermined feature edges in an altered design database to decrease the risk of features widths, feature spaces or feature enclosures being patterned smaller than designed. In some embodiments, the upsized features are larger in the wafer circuit pattern than are drawn in a designed database. In other embodiments, the method for improving manufacturability of a design is stored on a computer readable storage medium.

BRIEF DESCRIPTION OF THE DRAWINGS

The present invention may be better understood, and its numerous objects, features, and advantages made apparent to those skilled in the art, by referencing the accompanying drawings.

The use of the same reference symbols in different drawings indicates similar or identical items. Furthermore, skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following discussion is intended to provide a detailed description of at least one example of the invention and should not be taken to be limiting of the invention itself. Rather, any number of variations may fall within the scope of the invention which is properly defined in the claims following this description.

It has been discovered that design for manufacturability techniques may be used to modify circuit layouts to improve mask fabrication to reduce expected defects in an integrated circuit manufactured using such improved masks. For example, a circuit layout may be modified prior to manufacturing of the mask (and even prior to standard OPC). OPC tries to recreate the physical layout designer's intent given expected manufacturing defects. OPC corrects for systematic variation in the manufacturing process. The technique disclosed herein alters the physical layout designer's intent, both by correcting for manufacturing process defects and by taking advantage of the circuit layout (e.g., by expanding elements into available space, but not necessarily solely to avoid a known, pre-programmed manufacturing defect). The technique disclosed herein moves elements or portions of elements. The technique disclosed herein also uses information from other layers to move elements in a target layer. Furthermore, the technique disclosed herein can move elements in a non-target layer to modify a target element in a target layer.

Figure 1:
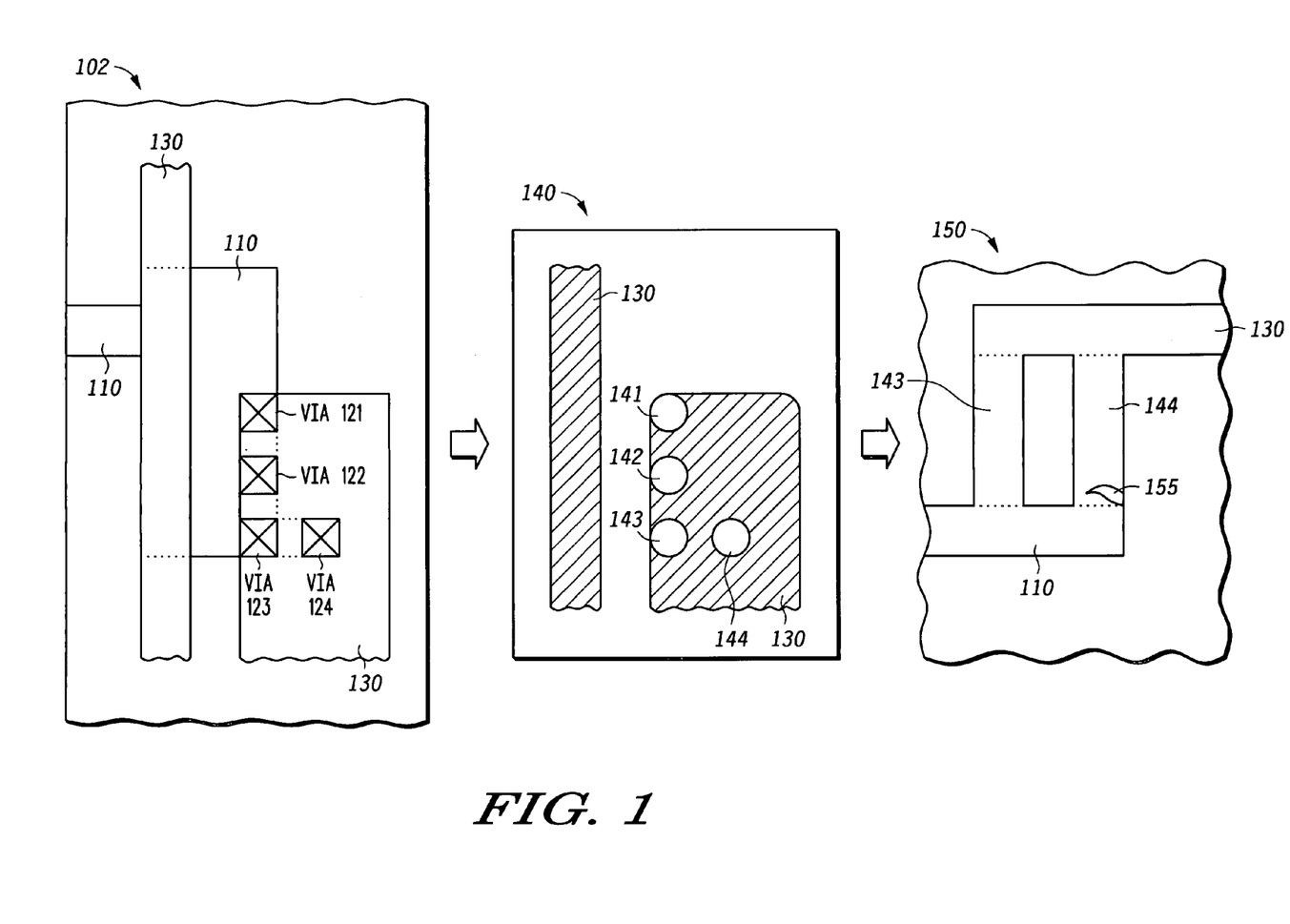
FIG. 1 is a block diagram illustrating a circuit in various forms including circuit layout, fabrication, and fabrication cross-section for modification in accordance with one embodiment of the present disclosure.

FIG. 1 illustrates a circuit layout 102 which is fabricated into circuit pattern 140. FIG. 1 further shows a cross-section view 150 of fabricated circuit 140. As illustrated, layout 102 is a graphical representation of a circuit layout such as may be provided via a graphic design system (GDS) file or other means of representing circuit layouts. Layout 102 includes various circuit layers such as metal layer 2, indicated by reference numeral 110, and metal layer 3, indicated by reference numeral 130. Layout 102 further includes various vias, for example, via 121, via 122, via 123 and via 124. As illustrated, via 124 is relatively isolated from other circuit elements in layout 102.

When fabricated, the square-shaped vias 121-124 of layout 102 resolve to corresponding, but more circular-shaped, vias 141-144 illustrated in the top-view of the circuit pattern fabrication 140. As illustrated in cross-section 150 of FIG. 1, vias 143 and 144 electrically connect metal layer 110 and metal layer 130. However, due to the relatively isolated nature of via 144, defects may occur such as defect 155. Defect 155 can adversely impact the functionality of the final integrated circuit. Such defects may be prevented through modification of the layout 102 prior to fabrication of the integrated circuit, using one or more of the various methods according to the embodiments of the present disclosure.

Figure 2:
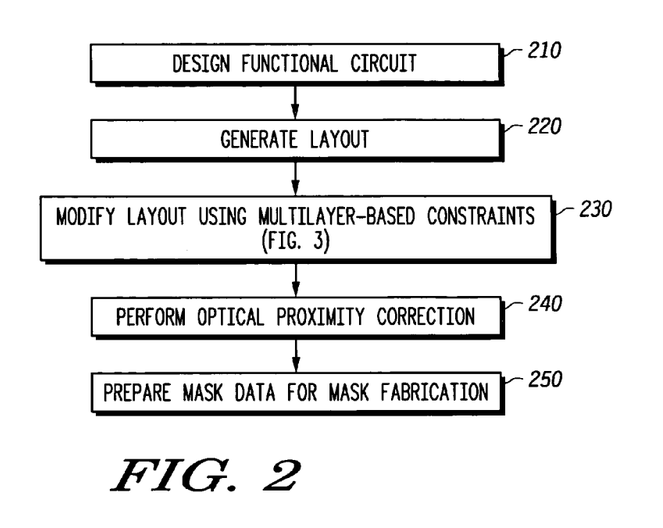
FIG. 2 is a flow chart illustrating an integrated circuit design flow in accordance with an embodiment of the present disclosure.

FIG. 2 shows a circuit design flow which incorporates a multilayer-based, manufacturing-oriented modification step according to one embodiment of the present disclosure. As illustrated, a functional circuit is designed during design operation 210 using techniques known in the industry. After the functional circuit is designed, a physical layout is generated during layout operation 220. For example, a software representation including spatial aspects of the circuit layout is generated and provided. After the physical layout is provided, the layout is modified during a modification operation 230. In particular, the modification operation 230 includes modification of the layout using multilayer-based constraints. In other words, the layout is modified using information from multiple layers of the circuit layout to account for manufacturing defects. Such a modification is described in further detail below, at least with reference to FIG. 3. After the layout is modified during modification operation 230, standard optical proximity correction may be performed during OPC operation 240. After OPC operation 240, mask data is prepared to fabricate a mask during mask operation 250.

Figure 3:
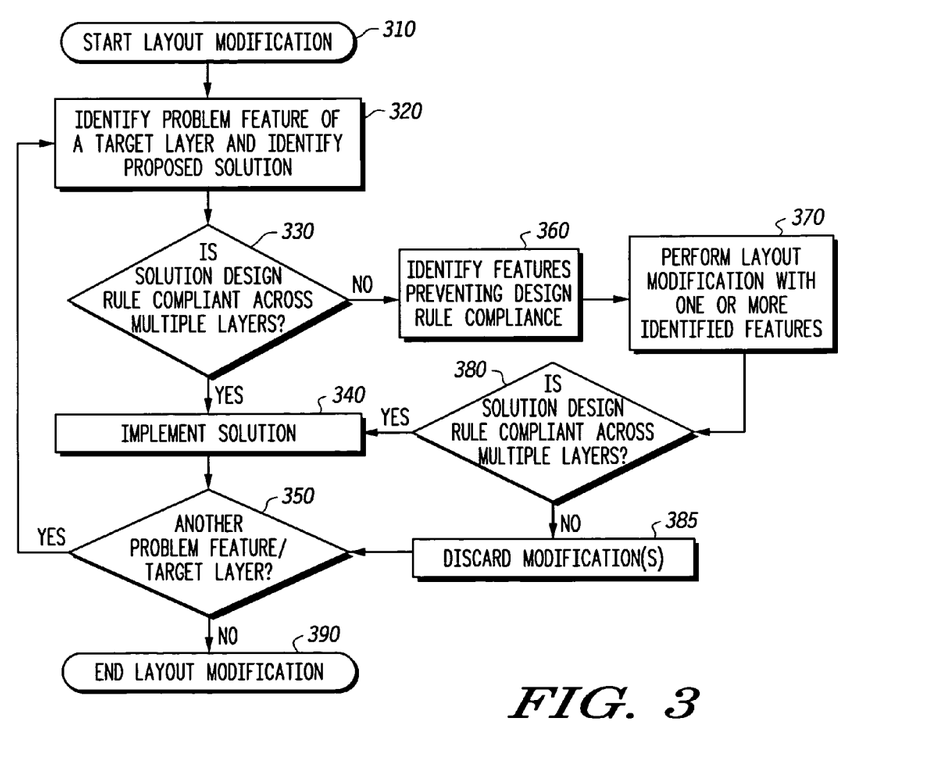
FIG. 3 is a flow chart illustrating multilayer-based layout modification in accordance with one embodiment of the present disclosure.

FIG. 3 is a flow chart illustrating multilayer-based layout modification in accordance with one embodiment of the present disclosure. A received layout representation such as a GDS file is processed beginning at start layout modification operation 310. A circuit layout typically includes multiple layers of circuitry and interconnects. During an identification operation 320, processing of the layout representation occurs, wherein the identification operation identifies problem features. In one embodiment, the identification operation compiles a list of problem features for each layer. A target layer may be selected, and a first, or target, problem feature of a list of target layer problem features may be selected. For example, a list of isolated contacts may be compiled for a target layer.

Referring still to identification operation 320, once a target problem feature is identified and/or selected, a proposed solution is identified to address the corresponding problem feature. In the illustrated embodiment, a single solution is identified, but more than one solution may be applied, in parallel or in a sequence. For example, for each isolated contact, one solution is to increase the size of the isolated contact, for example by increasing its size in two directions or four directions.

After a target problem feature and proposed solution are identified during identification operation 320, the solution is tested during query operation 330. Query operation 330 operates to determine whether the solution design is rule compliant across multiple layers. For example, a copy of the layout may be created including the solution, and a check can then be made to determine whether any design rules are violated in one or more layers. Continuing the isolated contact example from above, the increase in size of the isolated contact may cause some design rule violations due to excessive encroachment upon other, nearby elements, thereby causing a violation of a spacing requirement.

The test of solution design rule compliance of query operation 330 is performed across layers to ensure that the increased size does not overlap other elements. In a traditional OPC enlargement of such a feature, the increase in size is done in anticipation of the feature shrinking during fabrication. The proposed solution of operation 320, however, increases the size of the feature to make the feature more robust, more than by a mere amount of expected shrinkage. Also, the proposed solution may include the moving of a feature. Accordingly, query operation 330 performs an interlayer design rule analysis to ensure the functionality of the circuit once the proposed solution is implemented.

If the solution causes no design rule violations, it is determined to be design rule compliant during query operation 330, and the solution is implemented during a solution implementation operation 340. For example, the solution might have been to increase the isolated contact in size in all directions within the target layer.

After the solution is implemented during operation 340, the method proceeds with query 350. Query 350 controls whether to transition another problem feature (or target layer) to the identification operation 320 for processing of additional problem features or target layers. In other words, if more problem features in the current target layer or other layers remain to be processed, then the query 350 directs the method to return to identification operation 320 and proceed with the next problem feature or target layer. On the other hand, if there are no other problem features to be processed, query 350 directs the process to the end layout modification operation 390. Accordingly, layout modification ends at the end layout modification operation 390.

If, during design rule compliance query operation 330, the solution is determined to be non-compliant, the final implementation of the solution is suspended, and other, nearby features are investigated as candidates for modification to allow the solution to be implemented in conformance with design rules. For example, if the tested solution is not design rule compliant, the features of the circuit layout which prevent design compliance of the solution are identified during identify operation 360. In other words, operation 360 identifies one or more features that are determined to be preventing design rule compliance of the solution. More specifically, if the exemplary isolated contact for which the solution included an increase in size encroaches on metal lines, a list is compiled of metal lines which would fail due to the prospective implementation of the solution.

After the features preventing design rule compliance are identified, one or more of the identified features are modified during performance of a layout modification operation 370. In other words, the method proceeds with the performance of a layout modification with the one or more features identified by operation 360. For example, an outside edge of a nearby, but electrically isolated, metal feature could be shifted away from the upsized via.

After the identified features are modified, the solution is again tested for design rule compliance during another solution design rule compliance query operation 380. If the solution is now design rule compliant (e.g., at least a partial result of the modification(s) to feature(s) during modification operation 370), then the solution is implemented in the layout during the implement solution operation 340, and the modification(s) made during modification operation 370 are also implemented in the circuit layout. If the solution is still not design rule compliant after modification operation 370 as determined by solution design rule compliance query operation 380, then the modification(s) are discarded via discard operation 385. Thereafter, the method transitions to query operation 350 with a query for another problem feature/target layer. Query operation 350 operates as discussed herein above.

Figure 4:
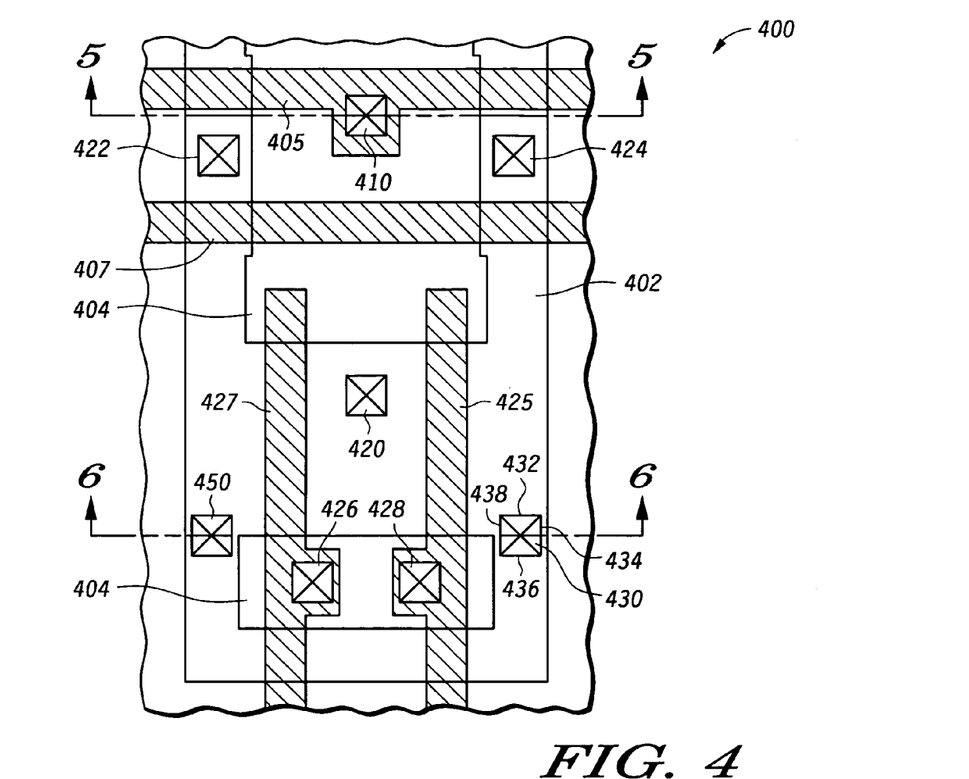
FIG. 4 is a top-view representation of a circuit layout prepared for modification in accordance with one embodiment of the present disclosure.

FIG. 4 illustrates the sizing and shifting of features in accordance with an embodiment of the present invention. FIG. 4 shows the top-down view of a portion of a typical static random access memory (SRAM) cell layout 400. The SRAM cell layout 400 includes three semiconductor processing layers, such as diffusion layer 402, polysilicon layer 425, and contact hole 410. Additional features illustrated in FIG. 4 include dielectric layer 404, polysilicon 405, 407 and 427, and contact holes 420, 422, 424, 426, 428, 430, and

450. In FIG. 4, contact hole 410 is positioned inside the polysilicon line 405. To improve the process window for printing the contact hole 410, it is desirable to upsize the contact hole 410 in all of its four edges.

Figure 5:
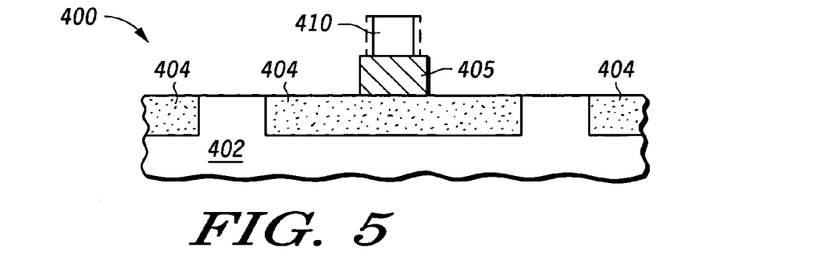
FIGS. 5 and 6 provide first and second cross-sectional views, respectively, of the circuit layout of FIG. 4.

FIG. 5 shows a cross-sectional view along the line 5-5 in FIG. 4. Upsizing of the contact hole 410 is illustrated in FIG. 5 by dashed lines proximate the solid lines of contact hole 410.

Referring again to FIG. 4, contact hole 430 is positioned inside the diffusion region 402. To improve the process window for printing the contact hole 430, it is desirable to upsize the contact hole 430 in three edges 432, 434, 436 of the contact hole. It is not desirable to upsize contact hole 430 in the remaining edge 438 because the distance between the edge 438 of the contact hole 430 and the polysilicon line 425 needs to be maintained so the contact hole 430 and polysilicon line 425 are electrically disconnected. To further increase the process window of the isolation between the contact hole 430 and the polysilicon line 425, it is desirable to downsize the contact hole only in the edge 438. By upsizing the contact hole edges 432, 434, 436 and by downsizing the contact hole edge 438, the method increase the process windows for patterning the contact hole 430 and the isolation between the contact hole 430 and the polysilicon line 425. Similarly, contact hole 450 can be upsized along three edges thereof, while the fourth edge is downsized to maintain contact hole 450 and polysilicon line 427 electrically disconnected.

Figure 6:
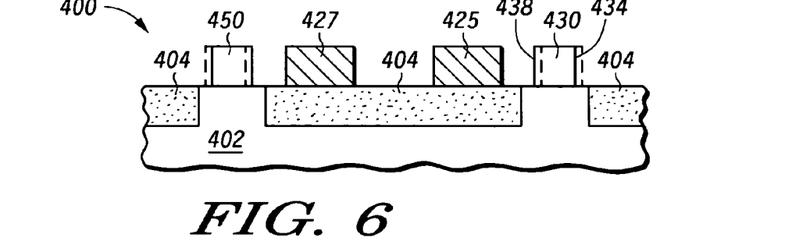

FIG. 6 shows the cross-section view along the line 6-6 in FIG. 4. Upsizing of the contact hole 450 is illustrated in FIG. 6 by dashed lines proximate the solid lines of contact hole 450.

Figure 7:
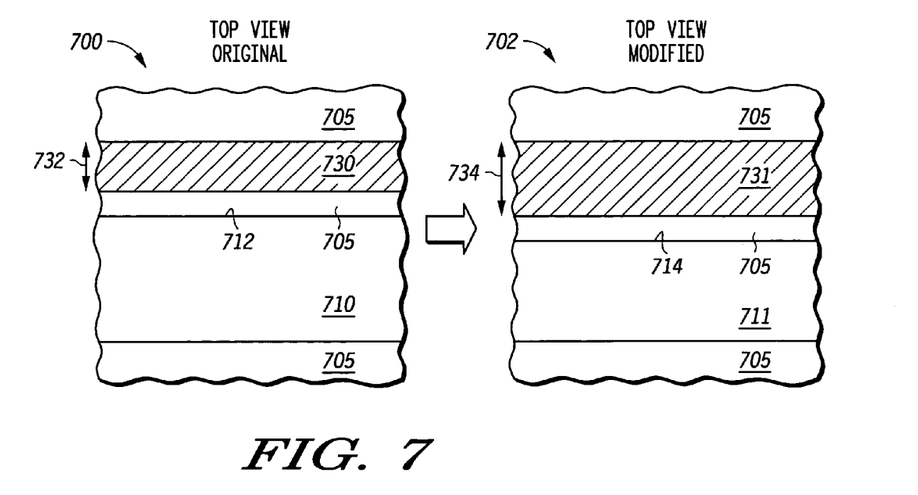
FIGS. 7-15 provide top-view representations of various portions of circuit layouts (as opposed to actual circuit fabrications) before and after modification in accordance with various embodiments of the present disclosure.

FIG. 7 illustrates the simultaneous sizing of multiple layers in accordance with an embodiment of the present invention. In layout 700, a narrow polysilicon line 730, having a width indicated by arrow 732, is patterned next to a diffusion region 710. The polysilicon line 730 and the diffusion region 710 are electrically isolated by an isolation region 705, in particular, along edge 712 of diffusion region 710, wherein isolation region 705 is located in between line 730 and region 710 along edge 712. To improve the process window for wafer patterning of the polysilicon line 730, it is desirable to upsize the polysilicon line 730 by an amount determined by the manufacturing process. A new polysilicon line 731 is thus formed, as illustrated by layout 702 of FIG. 7.

However, such an upsize may modify the circuit function significantly. For example, polysilicon line 731 can be upsized to have a width indicated by arrow 734, wherein the width 734 is greater than width 732. In layout 702, to minimize the circuit modification, the neighboring diffusion region 711 is downsized by a predetermined amount along the edge 714 facing polysilicon line 731. Note also that diffusion region 711 is only altered in regions which are greater than a predetermined distance from a gate region. The circuit function in the isolation region 705 on top and bottom portions of the views in FIG. 7 is thus unaltered.

Figure 8:
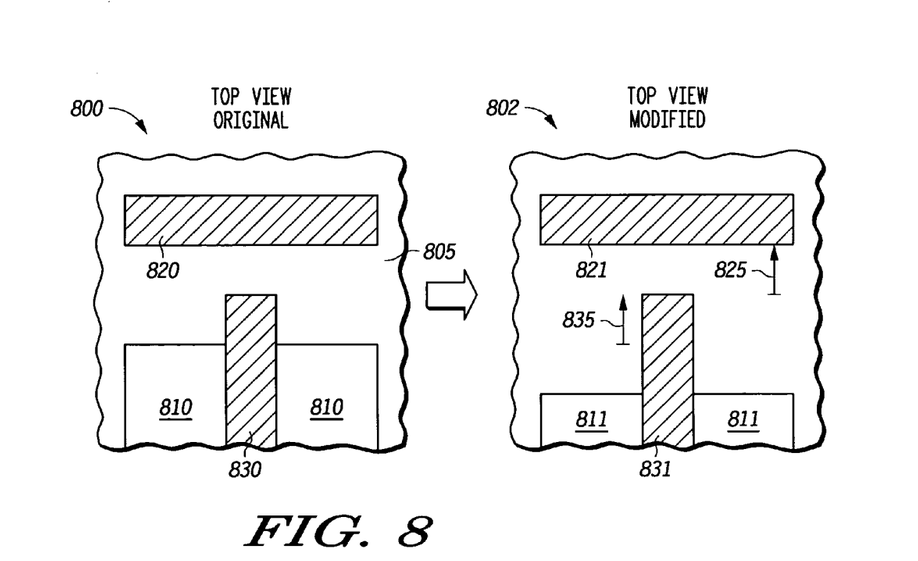

FIG. 8 illustrates the extending both outward and inward of feature edges in accordance with an embodiment of the present invention. In layout 800, a polysilicon line 830 extends beyond an edge of a diffusion region 810. The polysilicon line 830 and the diffusion region 810 are electrically isolated by an isolation region 805. In order to improve pattern fidelity during manufacturing of the portion of the line 830 overlapping diffusion 810, it is desirable to extend the polysilicon line 830 further beyond the active diffusion region 810 by a distance determined by the manufacturing process, such as distance 835 in layout 802.

However, such an extension by the distance 835 increases the risk of shorting to the nearby polysilicon line 820 of layout 800. Accordingly, in layout 802, the nearby line 820 of layout 800 is modified to form a new polysilicon line 821 of layout 802 by shifting it away from the end of the new target polysilicon line 831. The shift of line 820 of layout 800 is by an amount sufficient to reduce or eliminate the probability of shorting, for example, as indicated by arrow 825. The diffusion region 811 of layout 802 remains the same as diffusion region 810 of layout 800. In another embodiment, only the region of line 820 within a predetermined distance of the end of the nearby line 830 need be shifted (not shown).

Figure 9:
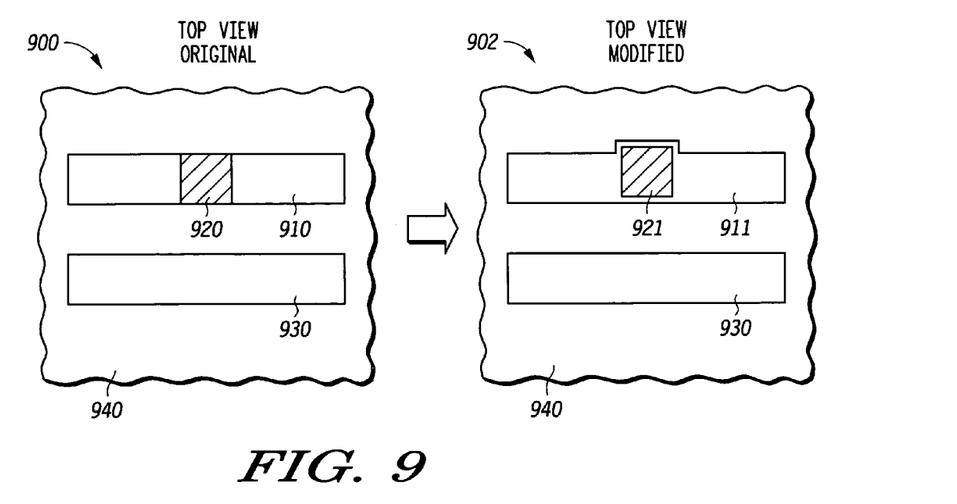

FIG. 9 illustrates the extending outward of feature edges on multiple interacting layers in accordance with an embodiment of the present invention. The original target layout 900 contains a metal line 910 enclosing a via 920. In close proximity to the metal line 910 is a parallel metal line 930, within isolation region 940. In order to improve pattern fidelity during manufacturing of the via 920, it is desirable to increase the size of via 920 and possibly the size of the containing metal line 910.

However, such an upsize increases the risk of shorting to the nearby metal line 930. In layout 902, via 920 of layout 900 is upsized into via 921 by moving out those feature edges not directly opposite the close metal line 930 of layout 900. In order to ensure continued enclosure of the via 921, the far edge of the containing metal line 910 of layout 900 can also be moved out away from the close metal line 930 of layout 900 in the area around the via 921 of layout 902, as illustrated by new metal line 911 of layout 902. In another embodiment, not illustrated here, the movement of the far edge of the containing metal line 911 is not restricted to the area around via 921. In yet another embodiment, also not illustrated here, via 921 may be upsized by pushing out multiple edges, but not the edge directly opposite the close metal line 930.

Figure 10:
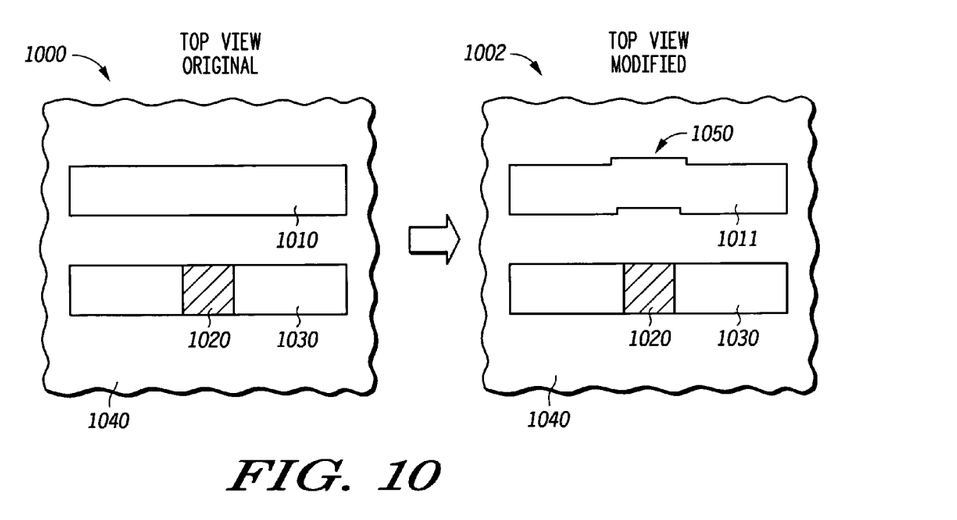

FIG. 10 illustrates the extending outward and inward of multiple feature edges in accordance with an embodiment of the present invention. The original target layout 1000 contains metal line 1010, a metal line 1030 enclosing a via 1020, and isolation region 1040. Note that in close proximity to the metal line 1030 is parallel metal line 1010. In order to reduce the possibility of bridging during manufacturing of the two metal lines 1010 and 1030 in the vicinity of via 1020, it is desirable to increase the distance between them in this area.

However, moving inward a single edge of either metal line 1010 or 1030 increases the probability of either line breaking during manufacturing. In layout 1002, metal line 1010 of layout 1000 not containing the via 1020 is modified into metal line 1011. In particular, region 1050 of line 1011 includes parallel edges that are pushed away from via 1020, in the immediate vicinity, each by a distance sufficient to reduce or eliminate the probability of shorting either line with the other. In another embodiment, not illustrated here, the movement of the edges of the metal line 1011 is not restricted to the area proximate or around the region via 1020, alone.

Figure 11:
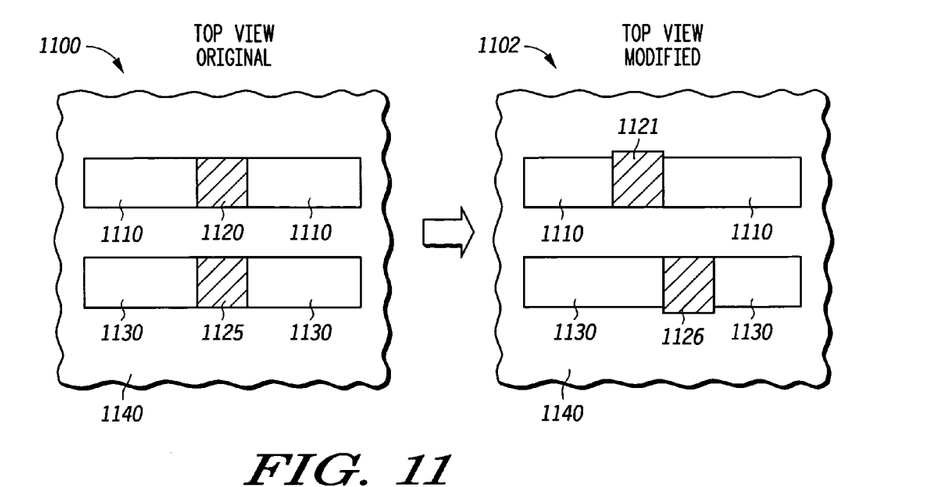

FIG. 11 illustrates the shifting of multiple feature edges in accordance with an embodiment of the present invention. The original target layout 1100 depicts two metal lines 1110 and 1130 within an isolation region 1140. Metal lines 1110 and 1130 each contains a via, indicated by reference numerals 1120 and 1125, respectively. The two vias 1120 and 1125 are at such a proximity to each other as to increase the risk of their bridging during manufacturing. To avoid this, it is desirable to increase the distance between them.

However, pushing the vias 1120 and 1125 apart in opposite directions increases the risk of insufficient enclosure of their containing metal lines 1110 and 1130, respectively. In layout 1102, the lateral edges of one via 1120 of layout 1100 are shifted by a predetermined distance in one direction, resulting in via 1121, while the lateral edges of the other via 1125 of layout 1100 are shifted in the other direction, resulting in via 1126.

Figure 12:
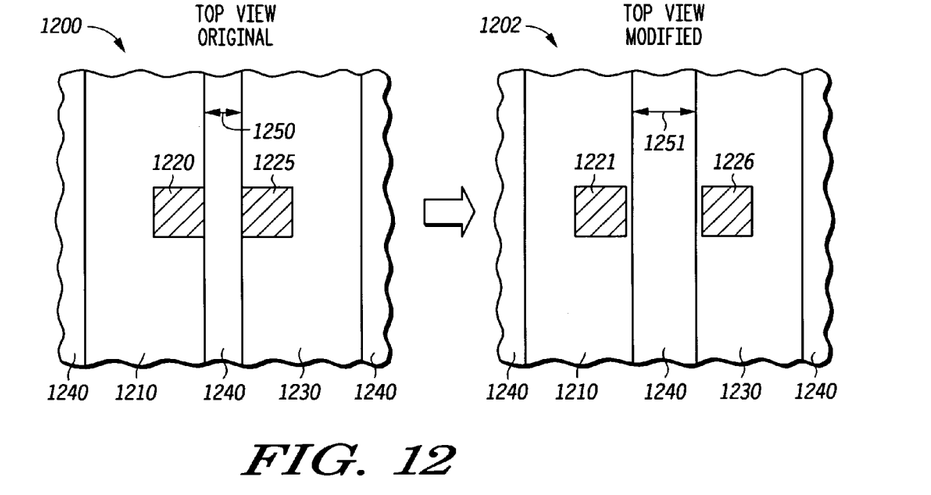

FIG. 12 is a top-view representation of a circuit layout 1200 suitable for modification in accordance with another embodiment of the present disclosure. Circuit layout 1200 includes interconnect features 1210 and 1230, via features 1220 and 1225, and isolation (or empty) regions 1240 which are devoid of interconnect and via features. Interconnect features 1210 and 1230 are placed at a minimum allowed spacing of 1250. Via features 1220 and 1225 are placed at a minimum allowed spacing of 1250 and are placed within interconnect features 1210 and 1230 respectively.

Still referring to FIG. 12, circuit layout 1202 represents an improved version of 1200 modified in accordance with one embodiment of the present disclosure. Opposing edges of interconnect features 1210 and 1230 are shifted to increase the space dimension 1250 of layout 1200 to be a new space dimension 1251 as shown in layout 1202. In addition, via features 1220 and 1225 of layout 1200 are also shifted in an opposing direction to become via features 1221 and 1226, respectively, of layout 1202 in order to maintain good overlap of interconnect features 1210 and 1230, respectively.

Figure 13:
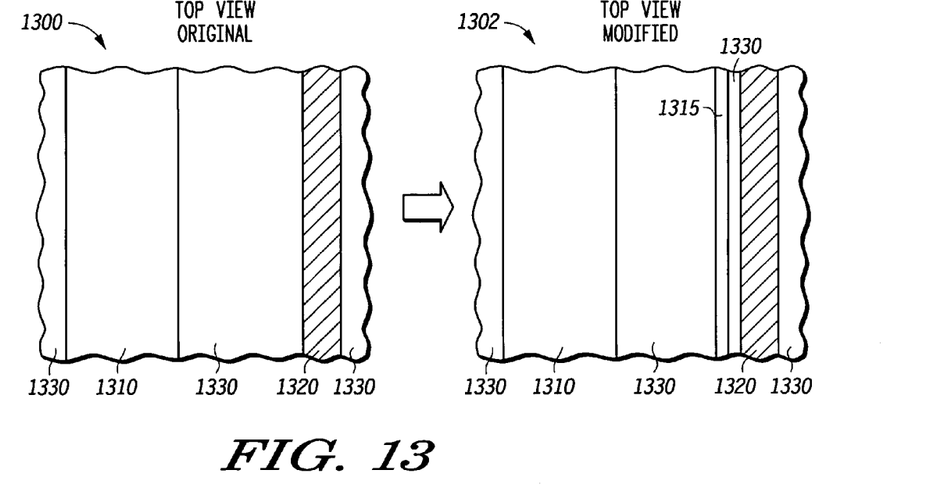

FIG. 13 is a top-view representation of a circuit layout 1300 suitable for modification in accordance with another embodiment of the present disclosure. Circuit layout 1300 includes implant feature 1310, diffusion feature 1320, and isolation (or empty) regions 1330 which are devoid of implant and diffusion features. Also shown in FIG. 13, circuit layout 1302 represents an improved version of layout 1300 in accordance with an embodiment of the present disclosure. While circuit layout 1302 contains generally unaltered features 1310, 1320 and 1330, circuit layout 1302 further contains implant feature 1315. More particularly, implant feature 1315 is created by edge movements of one or both of features 1310 and 1320. In addition, implant feature 1315 is positioned to create a shadow between implant feature 1310 and diffusion feature 1320 in order to prevent light scattering off of diffusion feature 1320 from negatively impacting the lithographic patterning of implant feature 1310. The dimension of implant feature 1315 may be such that it is not lithographically resolved during the lithographic patterning of implant feature 1310.

Figure 14:
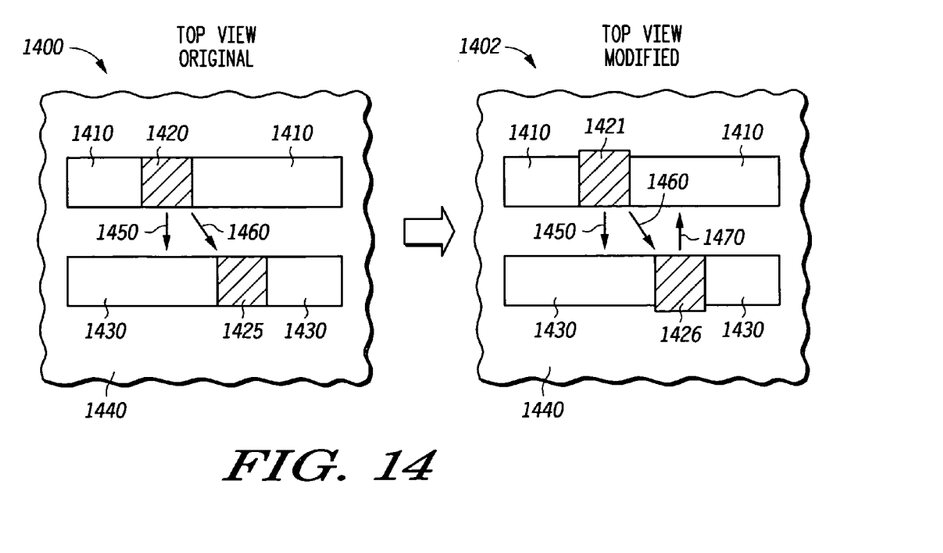

FIG. 14 is a top-view representation of a circuit layout 1400 suitable for modification in accordance with another embodiment of the present disclosure. Circuit layout 1400 includes interconnect features 1410 and 1430, via features 1420 and 1425, and isolation (or empty) regions 1440 which are devoid of interconnect and via features. Interconnect features 1410 and 1430 are separated by a minimum allowed spacing, for example, as indicated by arrow 1450. Via features 1420 and 1425 are placed proximate one another at a minimum allowed spacing, the via features being placed within interconnect features 1410 and 1430, respectively. Circuit layout 1402 represents an improved version of layout 1400 in accordance with the invention. One or both of via features 1420 and 1425 of layout 1400 are shifted away from the other via feature in layout 1402 to become via features 1421 and 1426 respectively with a decreased risk of via merging during patterning. Both via features 1421 and 1426 still substantially reside above or below interconnect features 1410 and 1430 respectively in order to maintain good electrical connection. Additionally, non-facing edges of via features 1421 and 1426 are sized outward in order to reduce the risk of being patterned too small. Note that in circuit layout 1402, it is not necessary for the outer edges of interconnect features 1410 and 1430 to be altered in order to maintain 100% enclosure of via features 1421 and 1426 respectively. In addition, a minimum allowed spacing, for example, as indicated by arrow 1470 can be maintained.

Figure 15:
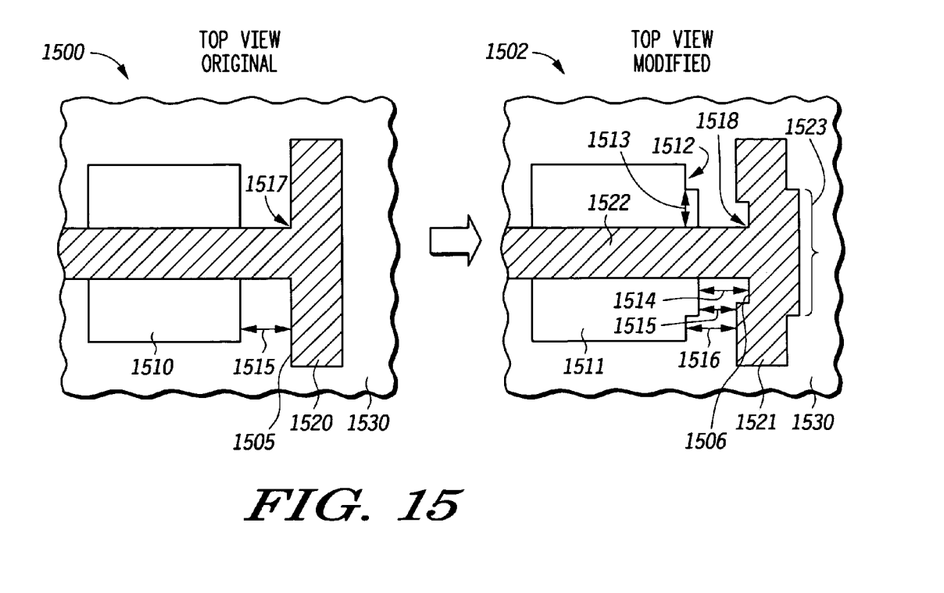

FIG. 15 is a top-view representation of a circuit layout 1500 suitable for modification in accordance with another embodiment of the present disclosure. Circuit layout 1500 includes a polysilicon feature 1520 partially overlying a diffusion region 1510. Polysilicon feature 1520 includes one or more interior corner 1517 and an edge 1505 which are displaced by a distance, indicated by arrow 1515, from an outside edge of diffusion region 1510. Circuit layout 1500 further includes an isolation (or empty) region 1530 devoid of polysilicon or diffusion features.

Also shown in FIG. 15, circuit layout 1502 represents an improved version of 1500 in accordance with an embodiment of the present disclosure. Circuit layout 1502 contains modified polysilicon feature 1521 partially overlapping modified diffusion region 1511. A portion of edge 1505 of layout 1500 has been shifted away from diffusion region 1511 of layout 1502 to create interior corner 1518 and edge 1506 at a space of 1514 from an outside edge of diffusion region 1511. The shift of edge 1505 was performed in order to reduce the risk of unintended overlap of diffusion region 1511 by interior corner 1518 in the presence of layer-layer alignment error during processing.

Note that other portions of edge 1506 are still maintained at a spacing 1515 to diffusion region 1511, corresponding to spacing 1515 in layout 1500. In order to not increase the risk of patterning failure of polysilicon feature 1520, edge 1523 of polysilicon feature 1521 is extended outwards into empty region 1530. Edge 1512 of diffusion feature 1511 has been shifted inwards to reduce the risk of unintended overlap of diffusion feature 1511 by polysilicon feature 1522. Note that edge 1512 is placed a distance 1513 from the intersection of features 1522 and 1511 in order to only impact diffusion region edges used for routing (routing diffusion) and to not degrade the electrical properties of circuit layout 1502. Note also that the portion 1522 of polysilicon feature 1521 which overlaps diffusion feature 1511 is substantially unchanged between circuit layouts 1502 and 1500 so that all changes between circuit layouts 1502 and 1500 occur on routing poly. Note also that the modified layout 1502 may also include a distance 1516 disposed between the diffusion feature 1511 and polysilicon feature 1521.

Figure 16:
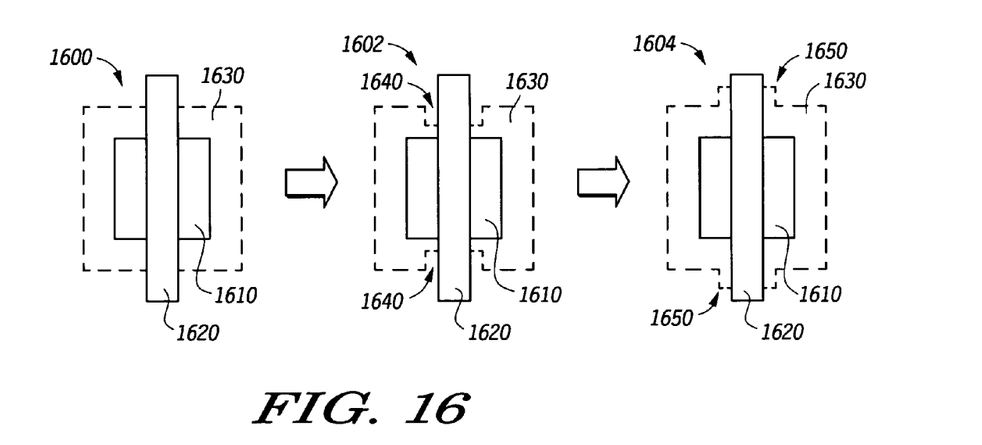
FIG. 16 is a top-view representation of a portion of another circuit layout prepared for modification in accordance with another embodiment of the present disclosure.

FIG. 16 shows a transistor device layout 1600 formed by an active area shape 1610 and a polysilicon shape 1620. The transistor is enclosed by an implant area 1630. Typically, the implant area is drawn larger than the active area to provide sufficient margin to overlay tolerances. A polysilicon pre-doping implant shape is derived from drawn implant shape 1630 using Boolean operations. In one embodiment, the pre-doping implant shape can be notched back over the polysilicon shape 1620 in order to reduce the enclosure of the polysilicon shape. Layout 1604 illustrates on example where notches 1640 are formed in the implant shape 1630 over the polysilicon region 1620. The formation of the notch 1640 reduces the enclosure of the polysilicon 1620 by the implant 1630 and hence provides additional margin against interdiffusion of the subsequently implanted species into regions of opposite dopant polarity and helps prevent degradation of such adjacent devices.

Referring still to FIG. 16, in another layout 1604, where the primary consideration is to protect the device under consideration against interdiffusion from other devices, the implant shape can be notched outwards, for example, as illustrated by notches 1650. This concept can be further extended by enlarging the entire implant shape where the device is sufficiently isolated in order to simplify implant lithographic patterning.

In the foregoing specification, the disclosure has been described with reference to various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for improving manufacturability of a semiconductor device layout design comprising:
    performing at least one interlayer space check and one intralayer space check on more than one of multiple interacting layers of a target design; and
    modifying the target design to create an altered target design database in response to the results of the space checks, wherein modifying the target design includes a first movement of a group of at least one edge on a feature within the target design to decrease a risk of one of feature widths, feature enclosure and feature spaces being patterned smaller than designed, and wherein modifying the target design further includes a second movement of a group of at least one edge on a feature to decrease a risk of one of feature widths, feature enclosure and feature spaces being patterned smaller than designed in response to the first movement of edges, wherein the first movement includes moving predetermined feature edges by moving edges of routing poly outward and interacting routing poly inward.

2. The method of claim 1, wherein modifying the target design includes utilizing at least one of design rule checking (DRC), rule-based optical proximity correction (RB-OPC) and model-based optical proximity correction (MB-OPC) software functions to perform one or more of the first movement and the second movement.

3. The method of claim 1, wherein the first movement includes moving predetermined feature edges by use of prioritization of the feature edges to be moved based upon at least one of electrical yield information and patterning process control capability.

4. The method of claim 1, wherein the first movement includes moving predetermined feature edges by shifting edges of vias and shifting edges of interacting metal features.

5. The method of claim 1, wherein the first movement includes moving predetermined feature edges by optimization of the distance which feature edges are moved based upon mask error factor (MEF) information.

6. The method of claim 1, wherein the first movement includes moving predetermined feature edges by shifting an edge of an interconnect feature with space less than a predetermined value to another non-electrically connected interconnect feature on the same layer in order to decrease the risk of feature merging and without reducing interconnect enclosure of via or contact features.

7. The method of claim 6, wherein shifting nearby edges of non-electrically connected interconnect features away from the other feature includes the shifting of via or contact features to prevent reduction in the interconnect enclosure of via or contact features.

8. The method of claim 1, wherein the first movement further includes moving predetermined feature edges by the shifting of at least one edge creating a concave corner from at least one of poly and active layers in response to the concave corner being at a space to the overlap of poly and active layers less than a predetermined value.

9. The method of claim 1, wherein modifying the target design further includes utilizing at least one of design rule checking (DRC) and layout versus schematic (LVS) software functions to verify that the design modifications have not violated predetermined design rules or circuit functionality.

10. The method of claim 9, wherein verification that the design modifications have not violated predetermined design rules or circuit functionality further includes removing the design modifications in response to a detection of violations.

11. The method of claim 1, wherein the first movement includes moving predetermined feature edges by upsizing features to be larger in a wafer circuit pattern than the corresponding features as drawn in a design database.

12. A method for improving manufacturability of a semiconductor device layout design comprising:
    performing at least one interlayer space check and one intralayer space check on more than one of multiple interacting layers of a target design; and
    modifying the target design to create an altered target design database in response to the results of the space checks, wherein modifying the target design includes a first movement of a group of at least one edge on a feature within the target design to decrease a risk of one of feature widths, feature enclosure and feature spaces being patterned smaller than designed, and wherein modifying the target design further includes a second movement of a group of at least one edge on a feature to decrease a risk of one of feature widths, feature enclosure and feature spaces being patterned smaller than designed in response to the first movement of edges, wherein the first movement includes moving predetermined feature edges by moving an edge of a line-end outward and moving an edge of an interacting feature inward.

13. A method for improving manufacturability of a semiconductor device layout design comprising:
    performing at least one interlayer space check and one intralayer space check on more than one of multiple interacting layers of a design; and modifying at least one of a contact, via or implant target design layers of the target design in response to results of the at least one of the space checks to create an altered target design database, wherein modifying the design includes moving at least one or more predetermined edges of a feature on the at least one of the contact, via or implant target design layers in order to decrease a risk of at least one of feature widths, feature spaces, feature electrical conductivity and feature enclosures being manufactured smaller than designed, wherein moving predetermined feature edges includes determining if the interconnect area enclosing a predetermined number of vias is greater than a predetermined value and upsizing the via to reduce the risk of the via conductivity being manufactured less than a predetermined value.

14. The method of claim 13, wherein modifying the target design includes utilizing at least one of design rule checking (DRC), rule-based optical proximity correction (RB-OPC) and model-based optical proximity correction (MB-OPC) software functions in order to move edges.

15. The method of claim 13, wherein shifting at least one edge of a via causes at least one of the position of the center of the via to be shifted and the shape of the via in the design database to become non-square.

16. The method of claim 13, wherein shifting at least one edge of a via includes at least partially merging at least two electrically connected vias.

17. The method of claim 13, wherein moving predetermined feature edges further includes the expanding of at least one edge outwards greater than one time and performing a subtraction operation between the expanded edges to create a sub-resolution assist feature.

18. The method of claim 17, wherein the sub-resolution assist feature is created to reduce the amount of obliquely reflected light incident from a reflective substrate upon a photoresist feature during a photolithography process.

19. The method of claim 13, wherein moving predetermined feature edges further includes optimization of the distance at which feature edges are moved based upon mask error factor (MEF) information.

20. The method of claim 13, wherein modifying the design further includes the use of at least one of design rule checking (DRC) and layout versus schematic (LVS) software functions to verify that the design modifications have not violated predetermined design rules or circuit functionality.

21. The method of claim 13, wherein modifying the design further includes shifting an edge of an implant feature to reduce the risk of dopant interdiffusion between opposite polarity implant regions.

22. The method of claim 13, wherein moving predetermined feature edges includes upsizing features to be larger in a wafer circuit pattern than the corresponding features as drawn in the design database.

* * * * *